(12) United States Patent
Imafuji et al.

(10) Patent No.: US 9,210,807 B2
(45) Date of Patent: Dec. 8, 2015

(54) WIRING SUBSTRATE

(71) Applicant: SHINKO ELECTRIC INDUSTRIES CO., LTD., Nagano-shi, Nagano (JP)

(72) Inventors: Kei Imafuji, Nagano (JP); Jun Yoshiike, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 30 days.

(21) Appl. No.: 14/084,038

(22) Filed: Nov. 19, 2013

(65) Prior Publication Data

US 2014/0138134 A1 May 22, 2014

(30) Foreign Application Priority Data

Nov. 21, 2012 (JP) ................. 2012-255040

(51) Int. Cl.
H05K 1/11 (2006.01)
H05K 1/03 (2006.01)
H05K 3/40 (2006.01)
H05K 3/34 (2006.01)
H05K 3/46 (2006.01)

(52) U.S. Cl.
CPC ................. *H05K 1/111* (2013.01); *H05K 1/11* (2013.01); *H05K 3/4007* (2013.01); *H05K 3/3452* (2013.01); *H05K 3/4682* (2013.01); *H05K 2201/0373* (2013.01); *H05K 2201/0769* (2013.01); *H05K 2201/099* (2013.01); *H05K 2201/2072* (2013.01); *H05K 2203/0594* (2013.01); *H05K 2203/1184* (2013.01)

(58) Field of Classification Search
CPC ......... H05K 1/111; H05K 1/18; H05K 1/181; H05K 2201/10674; H05K 3/3436; H05K 2201/099; H05K 2201/09472; H05K 2201/09863; H05K 2201/09827; H01L 2224/16; H01L 2224/73253; H01L 2224/16225; H01L 2924/15311; Y10T 29/49124; Y10T 29/49117

USPC .......... 174/250–268; 361/760, 767, 792–795; 257/734, 737, 777, 778

See application file for complete search history.

(56) References Cited

U.S. PATENT DOCUMENTS

| 6,512,185 B2* | 1/2003 | Itou ............................... 174/260 |
| 6,617,529 B2* | 9/2003 | Ishizuka et al. ............... 174/266 |
| 7,126,211 B2* | 10/2006 | Yang ............................. 257/678 |
| 7,211,892 B2* | 5/2007 | Yamashita .................... 257/737 |
| 8,367,939 B2* | 2/2013 | Ishido ........................... 174/260 |

FOREIGN PATENT DOCUMENTS

JP 2001-060760 3/2001

* cited by examiner

*Primary Examiner* — Ishwarbhai B Patel
(74) *Attorney, Agent, or Firm* — Rankin, Hill & Clark LLP (57) ABSTRACT

A wiring substrate includes: a connection pad having a first surface; a protective insulation layer formed on the first surface of the connection pad and having an opening portion therein, wherein a portion of the first surface of the connection pad is exposed from the opening portion; a metal layer having a lower surface facing the first surface of the connection pad and an upper surface opposite to the lower surface and formed on the first surface of the connection pad which is exposed from the opening portion, the metal layer including a raised portion that extends upward from the upper surface of the metal layer in a peripheral portion thereof; and a bump electrode formed on the upper surface of the metal layer.

9 Claims, 7 Drawing Sheets

WIRING SUBSTRATE

This application claims priority from Japanese Patent Application No. 2012-255040, filed on Nov. 21, 2012, the entire contents of which are herein incorporated by reference.

BACKGROUND

1. Technical Field

The present disclosure relates to a wiring substrate.

2. Description of Related Art

There have been known wiring substrates on which an electronic component such as a semiconductor chip is mounted. When solder bumps are provided on connection pads on such a wiring substrate, surface treatment layers such as a nickel layer/gold layer are formed on upper surfaces of the connection pads (see e.g., JP-A-2001-60760).

As described in an introduction section for explaining the present invention (see later), when producing the wiring substrate, a solder bump is formed on a connection pad exposed from an opening portion of a solder resist via a nickel layer. In this case, tin contained in the solder and copper contained in the connection pad are diffused through a gap between the nickel layer and an inner wall of the opening portion of the solder resist, and an intermetallic compound including tin, copper and the like is formed on a peripheral area of the nickel layer.

Such an intermetallic compound is mechanically brittle and thus easily damaged by external stress, which may lead to a connection failure of the solder bump.

SUMMARY OF THE INVENTION

An illustrative aspect of the present invention is to provide a wiring substrate with a reliable bump electrode on a connection pad exposed from an opening portion of a protective insulation layer.

According to one or more illustrative aspects of the present invention, there is provided a wiring substrate. The wiring substrate includes: a connection pad having a first surface; a protective insulation layer formed on the first surface of the connection pad and having an opening portion therein, wherein a portion of the first surface of the connection pad is exposed from the opening portion; a metal layer having a lower surface facing the first surface of the connection pad and an upper surface opposite to the lower surface and formed on the first surface of the connection pad which is exposed from the opening portion, the metal layer including a raised portion that extends upward from the upper surface of the metal layer in a peripheral portion thereof; and a bump electrode formed on the upper surface of the metal layer.

DETAILED DESCRIPTION

In the following, embodiments according to the present invention will be described with reference to the accompanying drawings.

Figure 1A:
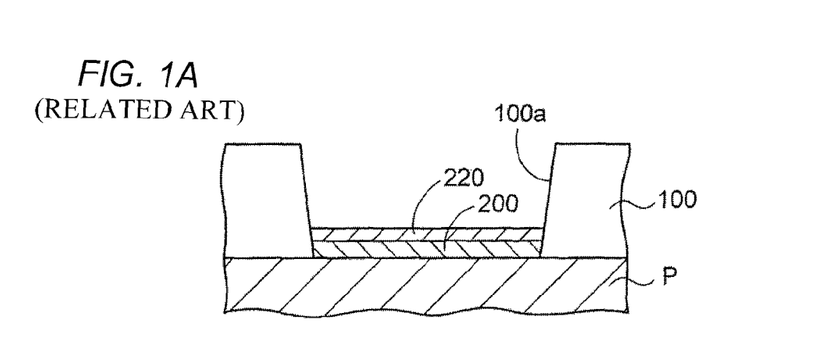
FIGS. 1A and 1B are cross-sectional views (Part 1) illustrating a method of producing a wiring substrate according to an introduction section for explaining the present invention.
Figure 1B:
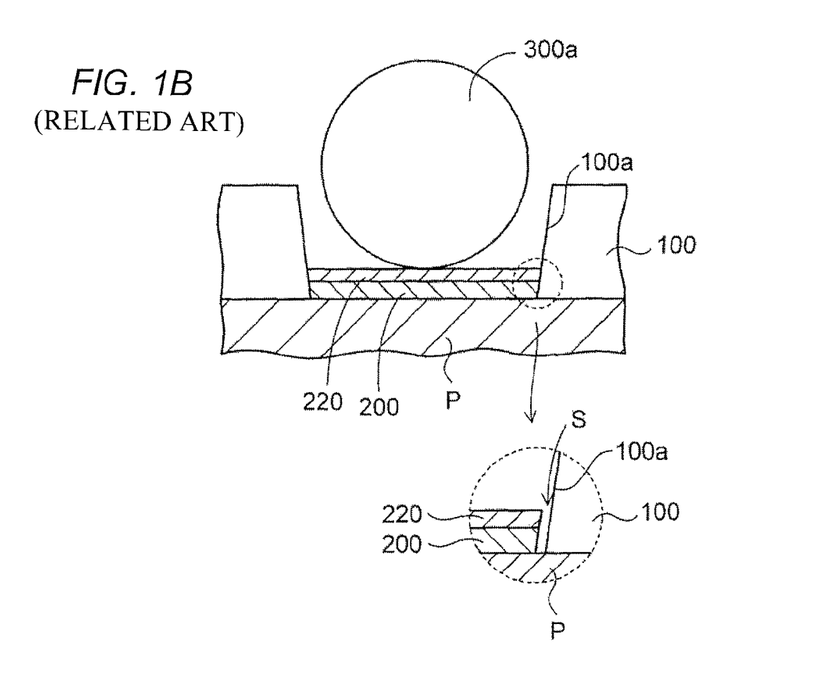

First, an introduction section will be explained for better understanding of the present invention, before detailed description of embodiments according to the present invention is given. FIGS. 1A and 1B partially illustrate a connection pad in a wiring substrate. Referring to FIG. 1A, the wiring substrate is provided with a connection pad P that is formed of copper and electrically connected to a multi-layer wiring (not illustrated), and a solder resist 100 that includes an opening portion 100a and formed on the connection pad P.

On the connection pad P which is exposed from the opening portion 100a of the solder resist 100, a nickel layer 200 and a gold layer 220 are formed in this order from the bottom by a non-electrolytic plating process. The nickel layer 200 is formed so as to serve as a barrier metal layer, and the gold layer 220 is formed so as to provide solder wettability.

Referring to FIG. 1B, a solder ball 300a is arranged inside the opening portion 100a of the solder resist 100. As illustrated in an enlarged partial view of FIG. 1B, a fine gap S of 2 to 3 μm or around is caused, because an inner wall of the opening portion 100a of the solder resist 100 is not chemically bonded with the nickel layer 200 and the gold layer 220.

Figure 2:
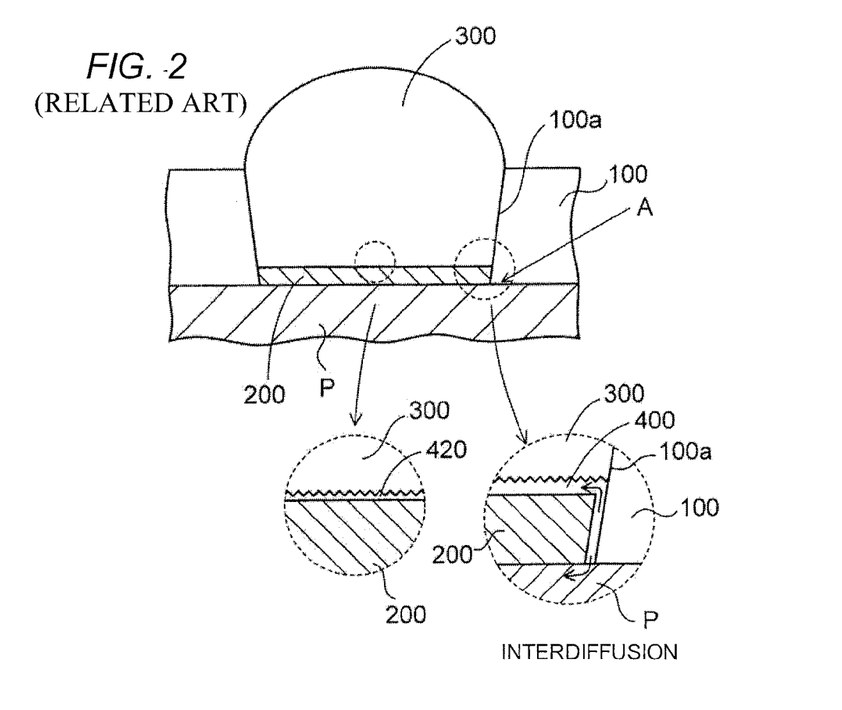
FIG. 2 is a cross-sectional view (Part 2) illustrating the method of producing the wiring substrate according to the introduction section.

Moreover, the solder ball 100a is melted by a re-flow heating process, and thus a solder bump 300 is obtained that is connected to the connection pad P by way of the nickel layer 200 as illustrated in FIG. 2. The gold layer 220 is diffused into the solder bump 300 and thus disappears when the re-flow heating process is performed.

As illustrated in an enlarged partial view of FIG. 2, solder goes into the connection pad P through the gap S (FIG. 1B) between the inner wall of the opening portion 100a of the solder resist 100 and the nickel layer 200. Here, tin (Sn) contained in the solder and copper (Cu) contained in the connection pad P are interdiffused quite rapidly, so that the copper contained in the connection pad P diffuses up to an upper peripheral surface of the nickel layer 200, and then the nickel layer 200 and copper on the nickel layer 200 chemically reacts with tin contained in the solder.

Therefore, a first intermetallic compound 400 (a Sn—Ni—Cu layer), which includes a relatively larger amount of Cu and has a relatively large thickness, is formed between the nickel layer 200 and the solder bump 300 in a peripheral area of the nickel layer 200. This intermetallic compound is also referred to as IMC.

In contrast, a second intermetallic compound 420 (a Sn—Ni layer), which scarcely contains copper and has a relatively small thickness, is formed in a center of the nickel layer 200. This is because copper scarcely diffuses to reach an upper surface of the nickel layer 200.

As such, the first intermetallic compound 400 is formed in the peripheral area of the nickel layer 200, while the second intermetallic compound 420 is formed in the center of the nickel layer 200, wherein the thickness of the first intermetallic compound 400 is larger than that of the second intermetallic compound 420. In other words, composition/structure and thickness of the intermetallic compound is varied depending on positions of the nickel layer 200.

When the solder ball 300*a* contains copper, the second intermetallic compound 420 may contain copper contained in the solder bump 300. In such a case, an amount of copper contained in a second intermetallic compound 420 (a Sn—Ni—Cu layer) is smaller than that contained in the first intermetallic compound 400 (a Sn—Ni—Cu layer).

Because intermetallic compounds are generally hard but brittle, damages or breakages tend to occur when stress is given. For this reason, from a viewpoint of ensuring a long-term reliability in electrical connections, the intermetallic compound needs to be thinner as much as possible.

As shown in FIG. 2, in a portion A where a lower portion of the inner wall of the opening portion 100*a* of the solder resist 100 and the connection pad P contact each other is likely to be given a stress caused by an impact from outside. In FIG. 2, the first intermetallic compound 400, which is mechanically brittle, exists immediately above the portion A which is likely to be given the stress. Therefore, when an impact is given from outside onto the structure, the first intermetallic compound 400 is firstly damaged, which results in the reduction in bonding strength of the solder bump 300.

Meanwhile, when the nickel layer 200 is formed to be thinner in response to request for miniaturization, cost reduction, or the like, a diffusion path of solder to the connection pad P is shortened, which facilitates interdiffusion of tin (Sn) contained in the solder and copper (Cu) contained in the connection pad P. Therefore, the first intermetallic compound 400 tend to be thicker.

Moreover, it should be noted that the nickel layer 200 formed by the non-electrolytic plating process tends to be thinner in the peripheral area thereof, which is located in the vicinity of the solder resist 100, than in the center area thereof.

For this reason, namely, when the nickel layer 200 becomes thinner in the peripheral area than in the center area thereof, the first intermetallic compound 400, which is mechanically brittle, is located closer to the portion A in which stress tends to concentrate. Therefore, the above problem becomes prominent.

In addition, when the solder resist 100 is thinner in response to requests for a thinner wiring substrate or the like, it becomes difficult to stably maintain the solder ball 300*a* (FIG. 1) on the connection pad P. Namely, the solder ball 300*a* may be removed from the opening portion 100*a* of the solder resist 100, for example, by vibrations caused in conveying the wiring substrate. As such, a defective wiring substrate may be produced where a solder ball is not mounted on the connection pad P or where two solder balls are joined together so that a larger solder bump is formed.

According to an embodiment of the invention described later, such troubles can be resolved.

FIGS. 3 through 7 illustrate a method of producing a wiring substrate according to an embodiment of the present invention. FIG. 8 illustrates a wiring substrate according to the embodiment of the present invention. In the following, a structure of the wiring substrate will be described along with explanations about the method of producing the same.

Figure 3:
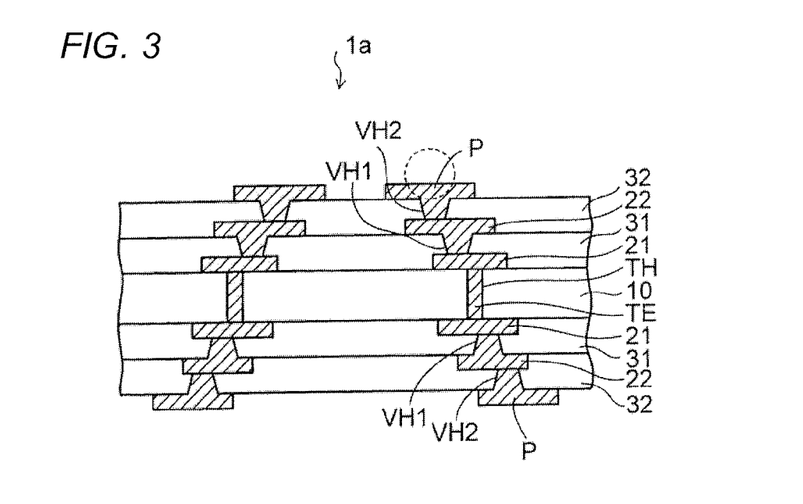
FIG. 3 is a cross-sectional view (Part 1) illustrating a method of producing a wiring substrate according to an embodiment of the present invention.

In the method of producing the wiring substrate according to this embodiment, as illustrated in FIG. 3, a wiring substrate 1*a* provided with connection pads P on both surfaces of the wiring substrate 1*a* is prepared. The wiring substrate 1*a* includes a core substrate 10 made of a glass epoxy resin or the like. Through holes TH are formed through the core substrate 10 and are filled with corresponding through electrodes TE. First wiring layers 21 are formed on both surfaces of the core substrate 10. The first wiring layer 21 on one surface of the core substrate 10 is electrically connected with the corresponding first wiring layer 21 on the other surface of the core substrate 10 by way of the through electrode TE formed in the through hole TH.

Also, the first wiring layers 21 formed on the opposite surfaces may be electrically connected with each other by way of a through hole plating layer formed on an inner wall of the through hole TH. In this case, a remaining (unfilled) portion of the thorough hole TH may be filled with a resin.

Two first insulating layers 31 are formed on the upper surface and on the lower surface of the core substrate 10, respectively. Each of the first insulating layers 31 has a first via hole VH1 that reaches the corresponding first wiring layer 21. Second wiring layers 22 are formed on the first insulating layers 31 which are formed on the upper and the lower surfaces of the core substrate 10. Each of the second wiring layers 22 is electrically connected to the corresponding first wiring layer 21 by way of the corresponding first via hole VH1.

In a similar manner, each of second insulating layers 32 is formed on the corresponding first insulating layer 31. Each of the second insulating layers 32 has a second via hole VH2 that reaches the corresponding second wiring layer 22. A connection pad P serving as a third wiring layer is formed on the corresponding second insulating layer 32, and connected to the corresponding second wiring layer 22 by way of the corresponding second via hole VH2. The connection pad P may be formed in an island-shape, or may be arranged to be connected to one end of a leading wiring.

The through electrode TE, the first wiring layer 21, the second wiring layer 22, and the connection pad P are formed of copper or the like. In addition, the first insulating layer 31 and the second insulating layer 32 are formed of an insulating resin such as an epoxy resin or a polyimide resin.

A coreless substrate, which does not include a core substrate, may be used to produce the wiring substrate. In addition, a wiring substrate may be used where a connection pad is embedded into an underlying insulating layer so that a side surface and a bottom surface of the connection pad are covered by the insulating layer and only an upper surface of the connection pad is exposed from the insulating layer.

Explanations about subsequent processes are made by showing a portion of the connection pad P that is located on an upper side of the wiring substrate 1*a* illustrated in FIG. 3.

Figure 4A:
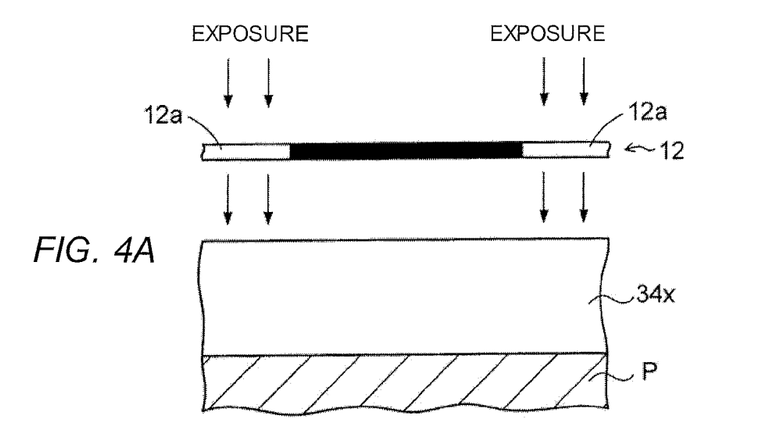
FIGS. 4A through 4C are cross-sectional views (Part 2) illustrating the method of producing the wiring substrate according to the embodiment of the present invention.

As illustrated in FIG. 4A, an epoxy-based negative type photosensitive resin film 34*x* is affixed on the second insulating layer 32 and the connection pad P, which is located on the upper side of the wiring substrate 1*a* as shown in FIG. 3. The photosensitive resin film 34*x* is, for example, 20 μm to 25 μm thick. As the photosensitive resin film 34*x*, a dry film resist can be preferably used. Specifically, as such a photosensitive resin film 34*x*, there may be, for example, "AUS410" made by Taiyo Ink Mfg. Co., Ltd.

Next, regions of the photosensitive resin film 34*x* other than an opening portion of the photosensitive resin film 34*x* are exposed to exposure light through light transmissive portions 12*a* of a photo mask 12, and the exposed photosensitive resin film 34x is developed. After this, the photosensitive resin film 34x is cured and thus hardened.

Figure 4B:
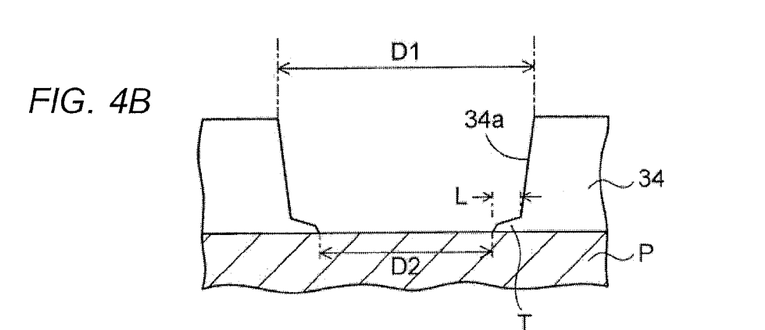

Thus, a solder resist 34 with an opening portion 34a can be obtained on the connection pad P, as illustrated in FIG. 4B.

Here, conditions of the above-mentioned photolithography are as follows. Namely, an exposure amount is set to be, for example, in a range of 400 mJ/cm$^2$ to 600 mJ/cm$^2$, and a development time is set to be, for example, in a range of 60 sec through 120 sec. This exposure amount is greater than a general exposure amount by about 20%.

By setting such photography conditions, the opening portion 34a of the solder resist 34 can have a tailed (or slanted) lower portion (see FIG. 4B). In other words, the solder resist 34 is formed so as to have a protrusion portion T that protrudes inward in the lower part of the inner wall of the opening portion 34a.

Figure 4C:
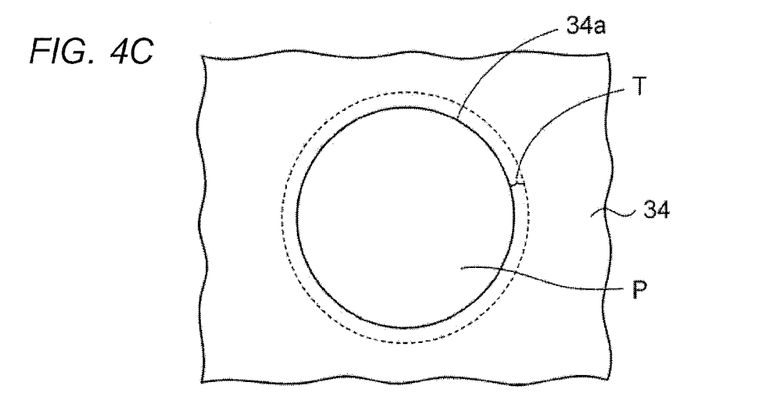

Referring to FIG. 4C, the opening portion 34a of the solder resist 34 is formed to have a circular plan view. In addition, the protrusion portion T is formed in a ring shape along the inner wall of the opening portion 34a.

Referring again to FIG. 4B, a diameter D1 of a top end of the opening portion 34a of the solder resist 34 is set to be, for example, in a range from 40 μm to 80 μm (preferably, 60 μm); and a diameter D2 of the bottom end of the opening portion 34a is set to be, for example, in a range from 20 μm to 60 μm (preferably, 45 μm).

Under such conditions, a protrusion length L of the protrusion portion T of the solder resist 34 is, for example, in a range from 5 μm to 10 μm.

With such a method, the solder resist 34, which has the opening portion 34a that is positioned above the connection pad P and also has the protrusion portion T that protrudes inward in the lower portion of the inner wall of the opening portion 34a, is formed on the wiring substrate 1a of FIG. 3.

Although the solder resist 34 is formed of the photosensitive resin film 34x in this embodiment, the solder resist 34 may be formed by a photolithography technique using a liquid resist in other embodiments.

In addition, while the solder resist 34 is used as an example of a protective insulation layer, which is an outermost layer of the wiring substrate, the protective insulation layer may be formed of various insulating materials having photosensitivity. For example, a solder resist made of other materials such as an acrylic material may be used.

Figure 5A:
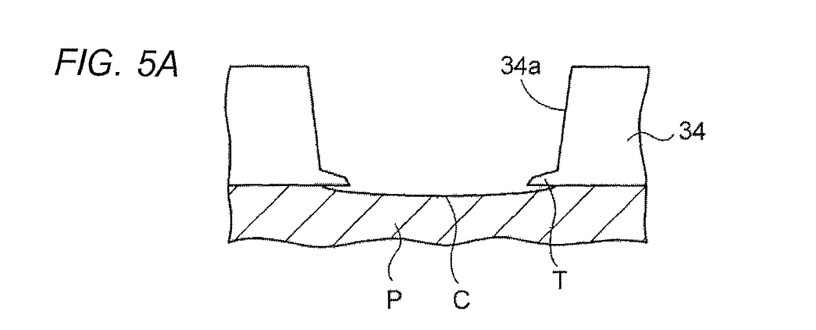
FIGS. 5A and 5B are cross-sectional views (Part 3) illustrating the method of producing the wiring substrate according to the embodiment of the present invention.

Next, an upper surface of the connection pad P is wet-etched through the opening portion 34a of the solder resist 34, so that a depressed portion C is formed as illustrated in FIG. 5A. When the connection pad P is formed of copper, a cupric chloride solution, a ferric chloride solution, or the like may be used as the etchant.

With such an etchant, the connection pad P is isotropically etched so that the depressed portion C is formed to have a circular plan view shape. In this case, a circumferential edge of the depressed portion C is positioned below the solder resist 34. Therefore, the protrusion portion T of the solder resist 34 is exposed not only at its upper side but also at its lower side. A depth of the depressed portion C is set to be, for example, in a range from 1 μm to 5 μm.

Figure 5B:
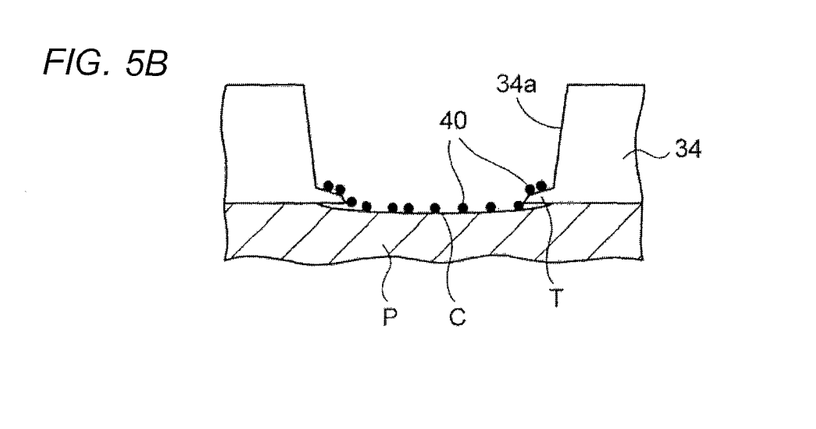

Subsequently, a structure illustrated in FIG. 5A is immersed in a catalytic solution for a non-electrolytic plating process. In the catalytic solution, palladium 40 is dissolved in a form of ions, so that a substitution reaction takes place over the connection pad P (Cu) and the palladium 40 selectively adhere to the upper surface of the depressed portion C of the connection pad P, as illustrated in FIG. 5B.

At this time, because the palladium 40 tends to adhere to rough or bubbly portions of the solder resist 34, the palladium 40 adheres to the protrusion portion T of the solder resist 34.

Figure 6A:
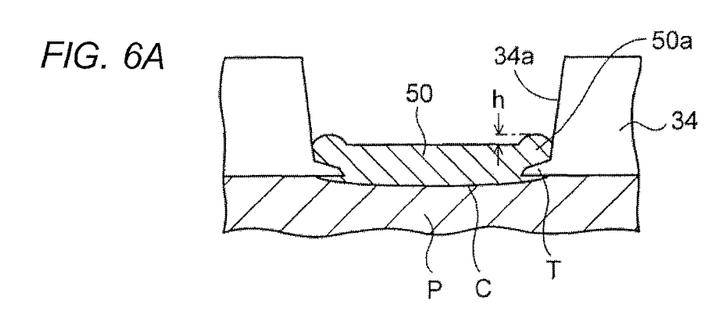
FIGS. 6A through 6C are cross-sectional views (Part 4) illustrating the method of producing the wiring substrate according to the embodiment of the present invention.

Next, nickel plating is performed through the non-electrolytic plating process using the palladium 40 as a catalyst. Thus, a nickel layer 50 serving as a barrier metal layer is formed on the depressed portion C of the connection pad P exposed from the opening portion 34a of the solder resist 34.

Because the palladium 40 adheres to the protrusion portion T of the solder resist 34, the nickel plating grows in an upward direction concurrently from the upper surface of the depressed portion C of the connection pad P and the upper surface of the protrusion portion T.

Thus, the nickel layer 50 is formed so as to have a raised portion 50a that is locally raised on the protrusion portion T of the solder resist 34. The raised portion 50a is formed in a position corresponding to the protrusion portion T of the solder resist 34. So, the raised portion 50a has a ring-shape. In an example in FIG. 6A, the highest portion of the raised portion 50a exists in a position inwardly separated, by a predetermined distance, from the inner wall of the opening portion 34a of the solder resist 34.

In addition, the nickel layer 50 is formed to fill a gap between the depressed portion C of the connection pad P and the protrusion portion T of the solder resist 34.

In this embodiment, the nickel layer 50 has the raised portion 50a that is raised upward in a peripheral portion of the nickel layer 50 as compared with other regions of the nickel layer 50, the thickness of the peripheral area of the nickel layer 50 can be greater than that of a corresponding area in the structure described in the introduction section.

A thickness of a center of the nickel layer 50 is, set to be, for example, in a range of 3 μm to 5 μm; and a height h (FIG. 6A) of the raised portion 50a is set to be, for example, in a range of 1 μm to 3 μm.

The nickel layer 50 is formed by the non-electrolytic plating process in this embodiment, but may be formed by an electrolytic plating process. In this case, the connection pad P is electrically connected to an electricity feeding layer, so that the nickel layer 50 having the same structure explained above is formed on the connection pad P.

In a case of the electrolytic plating process, an electric current density tends to be higher around the protrusion portion T of the solder resist 34, which makes it possible to form the raised portion 50a of the nickel layer 50 on the protrusion portion T of the solder resist 34.

When the nickel layer 50 is formed by the non-electrolytic plating process, phosphorus (P) or boron (B) is incorporated in the nickel layer 50. On the other hand, when the nickel layer 50 is formed by the electrolytic plating process, the nickel layer 50 is formed as a pure nickel layer that scarcely contains impurities. At any rate, phosphorous or boron may be contained in the nickel layer 50.

Figure 6B:
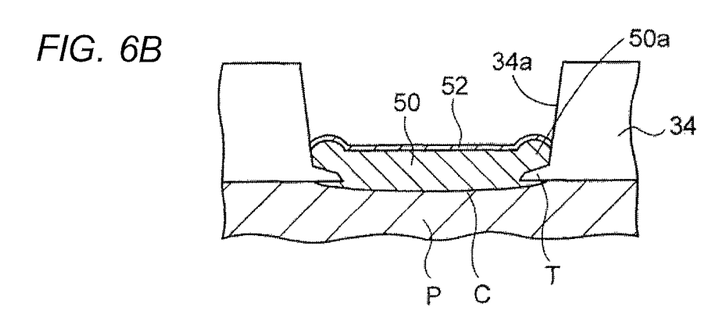

Next, referring to FIG. 6B, a gold (Au) layer 52 is formed on the nickel layer 50 by a non-electrolytic plating process. A thickness of the gold layer 52 is set to be, for example, in a range of 0.03 μm to 0.5 μm. The gold layer 52 is conformally formed following a surface profile of the nickel layer 50.

In such a manner, the nickel layer 50 and the gold layer 52 are formed in this order on the connection pad P. The nickel layer 50 is an example of a metal layer and is formed in order to prevent a chemical reaction between the connection pad P and the solder. In addition, the gold layer 52 is formed in order to provide a solder-wettability.

In addition to such a stacked film of the nickel layer 50/the gold layer 52, a stacked layer composed of a nickel (Ni) layer, a palladium (Pd) layer, and a gold (Au) layer stacked in this order from the bottom may be formed. In this case, a thickness of the palladium layer is set to be, for example, in a range of 0.02 μm to 0.2 μm; and a thickness of the gold layer is set to be, for example, in a range of 0.03 μm to 0.5 μm.

In addition, the palladium layer may include a palladium-phosphorous alloy that contains phosphorous (P), rather than a pure palladium layer.

Figure 6C:
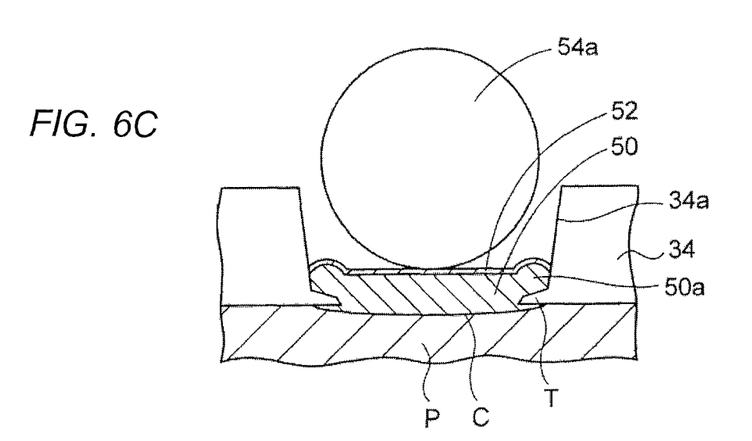

Next, referring to FIG. 6C, a solder ball 54a is arranged in the opening portion 34a of the solder resist 34. When a plurality of the solder balls 54a are arranged in the corresponding opening portions 34a, a ball-mounting apparatus is preferably used. With this apparatus, the solder balls 54a are provided in the corresponding opening portions 34a of the solder resist 34 through openings of the ball-mounting apparatus.

The solder ball 54a may be formed of a lead (Pb)-tin (Sn) based solder, a tin (Sn)-silver (Ag) based solder, or a tin (Sn)-silver (Ag)-copper (Cu) based solder.

Figure 7:
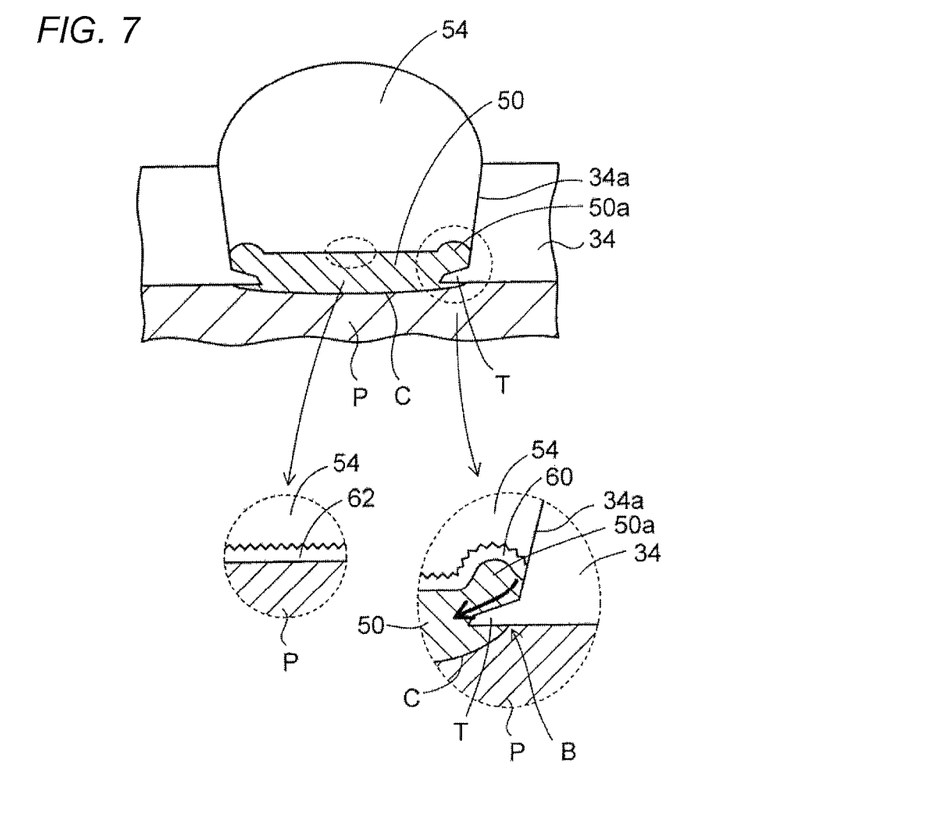
FIG. 7 is a cross-sectional view (Part 5) illustrating the method of producing the wiring substrate according to the embodiment of the present invention.
Figure 8:
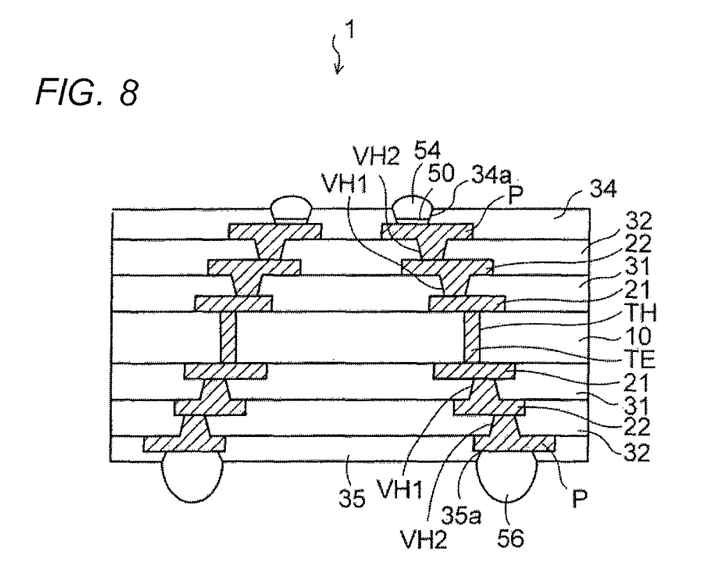
FIG. 8 is a cross-sectional view illustrating a wiring substrate according to an embodiment of the present invention.

Moreover, referring to FIG. 7, a solder bump 54 connected to the nickel layer 50 is obtained by performing a reflow-heating process thereby to melt the solder ball 54a. The gold layer 52 is diffused into the solder bump 54 and thus disappears during the reflow heating process.

In addition, when the stacked layer of the nickel layer/the palladium layer/the gold layer is used in the above process explained with reference to FIG. 6B, the palladium layer and the gold layer are diffused into the solder bump 54 and disappear.

Even in this embodiment, a fine gap exists between the inner wall of the opening portion 34a of the solder resist 34 and the nickel layer 50/the gold layer 52 in the structure illustrated in FIG. 6B, as is the case with the structure explained in the introduction section.

However, thanks to the raised portion 50a, the peripheral area of the nickel layer 50 becomes thicker than the corresponding area in the structure explained in the introduction section. In addition, the protrusion portion T, which protrudes inward, is provided at the lower portion of the opening portion 34a of the solder resist 34.

Therefore, when tin contained in the solder goes into the connection pad P through the gap between the nickel layer 50 and the inner wall of the opening portion 34a of the solder resist 34, the tin needs to take a longer path to reach the connection pad P, as illustrated by a bold arrow in an enlarged partial view of FIG. 7.

With this, the interdiffusion of the tin contained in the solder and copper contained in the connection pad P can be prevented, so that copper is restrained from diffusing into the peripheral area of the nickel layer 50.

Therefore, the first intermetallic compound 60 (a Sn—Ni—Cu layer) formed between the peripheral area of the nickel layer 50 and the solder bump 54 contains a less amount of copper, and thus is relatively thinner.

In addition, the second intermetallic compound 62 (a Sn—Ni layer), which scarcely contains copper and thus is relatively thinner, is formed on the center of the nickel layer 50, as is the case with the structure explained in the introduction section.

Thus, the structures/compositions of the first intermetallic compound 60 and the second intermetallic compound 62 on the nickel layer 50 can become similar to each other in this embodiment.

When the solder ball 54a contains copper, the second intermetallic compound 62 may contain copper contained in the solder bump 54. However, a contained amount of copper is lower in such a second intermetallic compound 62 (a Sn—Ni—Cu layer) than in the first intermetallic compound 60 (a Sn—Ni—Cu layer).

As shown in a partial enlarged view of FIG. 7, a stress caused by an impact from the outside is most likely to concentrate a portion B where a lower portion of the inner wall of the opening portion 34a of the solder resist 34 and the connection pad P contact each other. In this structure, the first intermetallic compound 60, which is mechanically brittle, exists above the portion B.

On the other hand, the peripheral area of the nickel layer 50 is thicker, due to the raised part 50a, than that of the nickel layer in the introduction section. Thus, it is possible to increase a distance between the first intermetallic compound 60 and the portion B in which stress tends to be concentrated. Therefore, when an impact is given from outside, stress given to the first intermetallic compound 60 is relaxed, which can prevent damages or breakages of the first intermetallic compound 60. With this, the solder bump 54 is bonded with the nickel layer 50 with a sufficient bonding strength.

In addition, the height of the raised portion 50a of the nickel layer 50 can be adjusted by adjusting the shape of the protrusion portion T of the solder resist 34 and the etching depth of the depressed portion C of the connection pad P. Therefore, even when the thickness of the nickel layer 50 is set to be thinner, the raised portion 50a having a desired height can be formed in the peripheral area of the nickel layer 50, so that a sufficient bonding strength of the solder bump 54 can be obtained.

In this embodiment, the nickel layer 50 is formed to have a depression shape as a whole, because of the raised portion 50a formed in the peripheral area of the nickel layer 50. Therefore, even when the solder resist 34 is thinner and thus the opening portion 34a of the solder resist is shallower than usual, the solder ball 54a can be prevented from falling out from the opening portion 34a at the time of arranging the solder ball 54a in the opening portion 34a. This is because the raised portion 50a may serve as a protective wall.

Therefore, the solder bump 54 can be reliably formed on the connection pad P which is exposed from the opening portion 34a of the solder resist 34.

In such a manner, the solder bumps 54 are formed on the nickel layers 50 formed on the corresponding connection pads P which is located on the upper side of the wiring substrate 1a of FIG. 3, as shown in FIG. 8.

Although the solder bumps 54 are formed using the solder ball 54a formed entirely of a solder in this embodiment, the solder bumps 54 may be formed of copper core solder balls, each of which is composed of a copper core and a solder layer coated on an outer surface of the copper core in order to form the solder bump 54. Alternatively, resin core solder balls, each of which is composed of a resin core and a solder layer coated on an outer surface of the resin core, may be used in order to form the solder bump 54.

Moreover, as illustrated in FIG. 8, a solder resist 35 is formed on the second insulating layer 32 on the lower side of the wiring substrate 1a of FIG. 3. The solder resist 35 has opening portions 35a above the corresponding connection pads P. In addition, external connection terminals 56, which are formed of a solder or the like, are provided on the connection pads P on the lower side of the wiring substrate 1a (FIG. 3).

The connection pads P and the external connection terminals 56 on the lower side may be formed in the same or similar manner as the connection pads P and the solder bump 54 on the upper side.

Through the above processes, a wiring substrate 1 according to this embodiment can be obtained as illustrated in FIG. 8. When a large substrate having a plurality of wiring substrates 1a formed therein is used, the large substrate is divided into each of the wiring substrate 1 (FIG. 8) at a certain timing, for example, before or after semiconductor chips (described later) are mounted on the corresponding wiring substrates 1.

Referring to FIG. 8, in the wiring substrate 1 according to this embodiment, the solder resist 34 having the opening portions 34a above the corresponding connection pads P is formed on the second insulating layer 32 on the upper side of the wiring substrate 1a shown in FIG. 3.

Similarly, the solder resist 35 having the opening portions 35a above the corresponding connection pads P is formed on the second insulating layer 32 on the lower side of the wiring substrate 1a shown in FIG. 3.

The solder bumps 54 are formed on the corresponding connection pads P exposed from the corresponding opening portions 34a of the solder resist 34 on the upper side. In addition, the external connection terminals 56 are provided for the corresponding connection pads P on the lower side.

Referring to FIG. 8 as well as FIG. 7, the solder resist 34 on the upper side of the wiring substrate 1 has the protrusion portion T that protrudes inward in a form of a ring at the lower portion of the opening portion 34a. Each of the connection pads P has the depressed portion C which is exposed from the opening portion 34a of the solder resist 34.

The depressed portion C of the connection pad P is formed by etching the upper surface of the connection pad P through the opening portion 34 of the solder resist 34. Through this etching process, an edge portion of the depressed portion C extends below the solder resist 34.

The nickel layer 50 is formed on the depressed portion C of the connection pad P, which is exposed from the opening portion 34a of the solder resist 34, and on the protrusion portion T of the solder resist 34. The peripheral area of the nickel layer 50 serves as the raised portion 50a that extends more upwardly than any other regions of the nickel layer 50. The raised portion 50a of the nickel layer 50 is arranged to face the protrusion portion T of the solder resist 34.

The highest point of the raised portion 50a of the nickel layer 50 is inwardly separated from the inner wall of the opening portion 34a by a predetermined distance. The nickel layer 50 is formed of a non-electrolytic plating layer or an electrolytic plating layer, as described above.

Moreover, the solder bump 54 is formed on the nickel layer 50. The solder bump 54 is embedded into the opening portion 34a of the solder resist 34, and protrudes from the upper surface of the solder resist 34.

In the wiring substrate 1 according to this embodiment, the peripheral area of the nickel layer 50, which serves as the raised portion 50a, is sufficiently thick. In addition, the solder resist 34 is provided with the protrusion portion T at the lower portion of the opening portion 34a thereof. Therefore, when the solder bump 54 is formed, it takes a relatively long distance for solder to penetrate from an edge of the nickel layer 50 to the connection pad P, which can restrain tin contained in the solder and copper contained in the connection pad P from interdiffusing with each other.

Thus, an intermetallic compound that contains a larger amount of copper and has a large thickness can be restrained from being formed on the peripheral area of the nickel layer 50.

In addition, even if the first intermetallic compound 60 (a Sn—Ni—Cu layer), which is mechanically brittle, is formed on the peripheral area of the nickel layer 50, the distance between the first intermetallic compound 60 and the portion B in which stress is likely to be concentrated can be increased. Therefore, the first intermetallic compound 60 can be prevented from being damaged or broken.

With this, the solder bump 54 is bonded with the nickel layer 50 with a sufficient bonding strength, which can improve the reliability of electrical connections in and around the connection pads P.

In addition, in this embodiment, the nickel layer 50 is formed to have the depressed cross-sectional shape due to the raised portion 50a, and thus serves as the protective wall. Therefore, the solder ball 54a can be prevented from falling out from the opening portion 34a. Thus, the solder bumps 54 are reliably formed in the corresponding opening portions 34a.

Figure 9:
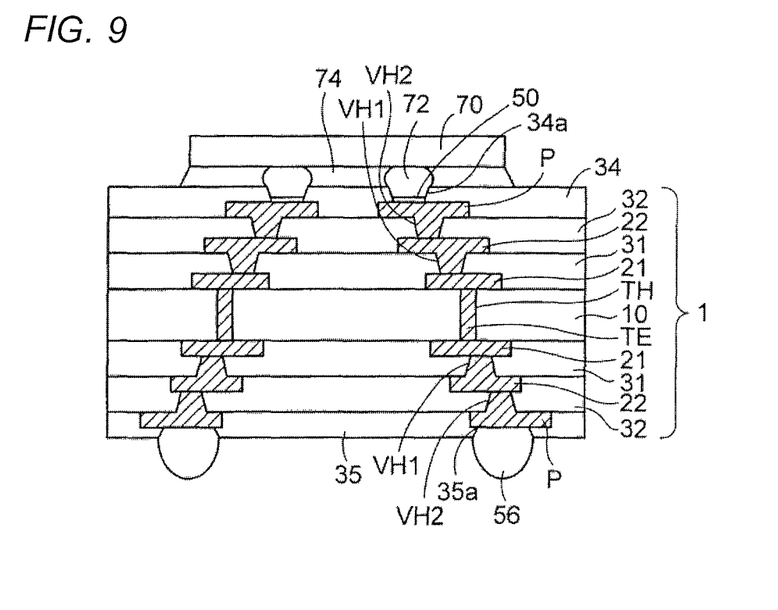
FIG. 9 is a cross-sectional view illustrating a semiconductor device where a semiconductor chip is mounted on a wiring substrate according to an embodiment of the present invention.

FIG. 9 illustrates a semiconductor device including the wiring substrate 1 and a semiconductor chip mounted on the wiring substrate 1. In FIG. 9, electrodes (not illustrated) of a semiconductor chip 70 are bonded onto the corresponding solder bumps 54 on the upper side of the wiring substrate 1 of FIG. 8, so that the semiconductor chip 70 is electrically connected to the wiring substrate 1 by way of bump electrodes 72. Then, an under-fill resin 74 is filled between the semiconductor chip 70 and the wiring substrate 1.

The external connection terminals 56 of the wiring substrate 1 having the semiconductor chip 70 mounted thereon are connected to corresponding terminals of a mounting board such as a mother board.

Although the nickel layer 50 is used as an example of a barrier metal layer in the above embodiment, another barrier metal layer such as a cobalt (Co) layer may be formed in the same manner, in the place of the nickel layer 50.

In addition, although the solder bump is formed on the connection pad via the barrier metal layer, a bump electrode which is formed of various metals can be used instead of the solder bump in the above embodiment.

Various aspects of the subject matter described herein are set out non-exhaustively in the following numbered clauses:

1. A method of producing a wiring substrate, the method comprising:
  (a) preparing a wiring substrate including a connection pad;
  (b) forming a protective insulation layer having an opening portion on the wiring substrate such that a portion of the connection pad is exposed from the opening portion, wherein the protective insulting layer comprises a protrusion portion that extends from an inner wall of the opening portion in a lower portion of the protective insulating layer;
  (c) forming a metal layer on the portion of the connection pad which is exposed from the opening portion; and
  (d) forming a bump electrode on the metal layer.

2. The method of clause 1, further comprising:
  (e) forming a depressed portion in an upper surface of the connection pad such that the depressed portion is communicated with the opening portion.

3. The method of clause 1, wherein step (c) comprises:
  forming the metal layer on the portion of the connection pad which is exposed from the opening portion so as to cover the protrusion portion.

4. The method of clause 1, wherein step (c) comprises:
  forming the metal layer comprising a raised portion that extends upward from an upper surface of the metal layer in a peripheral portion thereof.

5. The method of clause 4, wherein an uppermost portion of the raised portion is separated from an inner wall of the opening portion by a certain distance.

6. The method of clause 1, wherein the metal layer is formed by either one of a non-electrolytic plating process and an electrolytic plating process.

7. The method of clause 1, wherein the connection pad includes copper; the metal layer includes nickel; and the bump electrode includes solder.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring substrate comprising:
a connection pad having a first surface;
a protective insulation layer formed on the first surface of the connection pad and having an opening portion therein, wherein a portion of the first surface of the connection pad is exposed from the opening portion;
a metal layer having a lower surface facing the first surface of the connection pad and an upper surface opposite to the lower surface and formed on the first surface of the connection pad which is exposed from the opening portion, the metal layer comprising a raised portion that extends upward from the upper surface of the metal layer in a peripheral portion thereof; and
a bump electrode formed on the upper surface of the metal layer,
wherein the protective insulation layer comprises a protrusion portion that extends from an inner wall of the opening portion in a lower portion of the protective insulation layer, wherein a slope of the protrusion portion is less than a slope of the inner wall in an upper portion of the protective insulation layer.

2. The wiring substrate of claim 1, wherein the connection pad has a depressed portion which is formed in the first surface thereof and communicated with the opening portion.

3. The wiring substrate of claim 1, wherein the metal layer is formed on the first surface of the connection pad which is exposed from the opening portion so as to cover the protrusion portion, and
the raised portion is positioned just above the protrusion portion.

4. The wiring substrate of claim 1,
wherein an uppermost portion of the raised portion is separated from an inner wall of the opening portion by a certain distance.

5. The wiring substrate of claim 4, wherein the uppermost portion of the raised portion is spaced from an edge of the metal layer adjacent to the inner wall of the opening portion.

6. The wiring substrate of claim 4, wherein a distance between the uppermost portion of the raised portion and a lowermost portion of the raised portion is in a range of 1 μm to 3 μm.

7. The wiring substrate of claim 1, wherein the metal layer is either one of a non-electrolytic plating layer and an electrolytic plating layer.

8. The wiring substrate of claim 1, wherein the connection pad includes copper; the metal layer includes nickel; and the bump electrode includes solder.

9. The wiring substrate of claim 1, wherein the raised portion extends upward from the upper surface of the metal layer in the peripheral portion, so as to have a curved surface.

* * * * *